United States Patent

Yoshiki

(10) Patent No.: US 9,629,242 B2
(45) Date of Patent: Apr. 18, 2017

(54) OPTICALLY TRANSPARENT ELECTRODE

(75) Inventor: Takenobu Yoshiki, Tokyo (JP)

(73) Assignee: MITSUBISHI PAPER MILLS LIMITED, Tokyo (JP)

( * ) Notice: Subject to any disclaimer, the term of this patent is extended or adjusted under 35 U.S.C. 154(b) by 129 days.

(21) Appl. No.: 14/235,223

(22) PCT Filed: Jul. 19, 2012

(86) PCT No.: PCT/JP2012/068298
§ 371 (c)(1),
(2), (4) Date: Apr. 7, 2014

(87) PCT Pub. No.: WO2013/018549
PCT Pub. Date: Feb. 7, 2013

(65) Prior Publication Data

US 2014/0332262 A1  Nov. 13, 2014

(30) Foreign Application Priority Data

Jul. 29, 2011 (JP) .................................. 2011-166240
Nov. 11, 2011 (JP) .................................. 2011-247624

(51) Int. Cl.
H05K 1/02 (2006.01)
H05K 1/11 (2006.01)
G06F 3/044 (2006.01)

(52) U.S. Cl.
CPC .............. *H05K 1/115* (2013.01); *G06F 3/044* (2013.01); *H05K 1/0274* (2013.01); *G06F 2203/04111* (2013.01)

(58) Field of Classification Search
CPC ........... G06F 3/044; G06F 2203/04111; H05K 1/0274; H05K 1/115

(Continued)

(56) References Cited

U.S. PATENT DOCUMENTS

| 2009/0277672 | A1 | 11/2009 | Matsumoto | |
|---|---|---|---|---|
| 2011/0102370 | A1* | 5/2011 | Kono | G06F 3/044 345/174 |
| 2012/0118614 | A1* | 5/2012 | Kuriki | G06F 3/044 174/250 |

FOREIGN PATENT DOCUMENTS

| JP | 2003-077350 | 3/2003 |
|---|---|---|
| JP | 2005-250169 | 9/2005 |

(Continued)

*Primary Examiner* — Timothy Thompson
*Assistant Examiner* — Paul McGee, III
(74) *Attorney, Agent, or Firm* — Fitzpatrick, Cella, Harper & Scinto

(57) ABSTRACT

Provided is an optically transparent electrode of which the visibility of the electrode pattern is low. The optically transparent electrode is produced by joining two optically transparent conductive materials each having, on one side of the optically transparent base material, a large lattice 11 formed of a grid-like conductive part and a connector 12 which has at least one connector lattice 16 and which electrically connects adjacent large lattices 11, and is characterized by that the two optically transparent conductive materials are overlapped so that the centers of the connectors 12 thereof approximately coincide, and by that at least one of the two optically transparent conductive materials has a broken lattice 31 where a part of a thin line is broken and electrical conductivity is lost at a position corresponding to the overlapped connectors 12 and/or to a portion surrounded by the large lattice 11 and the connector 12.

8 Claims, 13 Drawing Sheets

(a)

(b)

(c)

(58) Field of Classification Search
USPC .......................................................... 174/261
See application file for complete search history.

(56) References Cited

FOREIGN PATENT DOCUMENTS

| | | |
|---|---|---|
| JP | 2007-188655 | 7/2007 |
| JP | 2007-287953 | 11/2007 |
| JP | 2007-287994 | 11/2007 |
| JP | 2010-262529 | 11/2010 |
| JP | 2011-113149 | 6/2011 |
| JP | 2011-129501 | 6/2011 |
| WO | WO 2011/062301 | 5/2011 |

* cited by examiner (a) (b) (c)

(d) (e) (g)

(f)

(a)

(b)

(c)

(d)

(e)

(f)

(g)

(a) (b)

(c)

(a)

(b)

(c)

(d)

OPTICALLY TRANSPARENT ELECTRODE

This application is a National Phase of PCT/JP2012/068298 filed Jul. 19, 2012, which in turn claims benefit of Japanese Applications No. 2011-166240 and 2011-247624, respectively filed on Jul. 29, 2011 and Nov. 11, 2011.

TECHNICAL FIELD

The present invention relates to an optically transparent electrode and, in particular, to an optically transparent electrode preferably used for projected capacitive touchscreens.

BACKGROUND ART

In electronic devices, such as personal digital assistants (PDAs), laptop computers, office automation equipment, medical equipment, and car navigation systems, touchscreens are widely used as their display screens that also serve as input means.

There are a variety of touchscreens that utilize different position detection technologies, such as optical, ultrasonic, capacitive, and resistive technologies. A resistive touchscreen has a configuration in which an optically transparent conductive material and a glass plate with a transparent conductive layer are separated by spacers and face each other. A current is applied to the optically transparent conductive material and the voltage of the glass plate with a transparent conductive layer is measured. By contrast, a capacitive touchscreen has a basic configuration in which an optically transparent base material has a transparent conductor layer thereon and there are no movable parts. Capacitive touchscreens, which have high durability and high transmission, are applied, for example, to in-car equipment.

As transparent electrodes (optically transparent conductive material) for touchscreens, optically transparent base materials having optically transparent conductive film made of ITO formed thereon have been commonly used. However, there have been problems of low total light transmittance due to high refractive index and high surface light reflectivity of ITO conductive films. Another problem is that ITO conductive films hare low flexibility and thus are prone to crack when bent, resulting in an increased electric resistance.

For the production of optically transparent conductive materials having an optically transparent conductive film which is an alternative to ITO films, a semi-additive method for forming a conductive pattern, comprising making a thin catalyst layer on a base material, making a resist pattern on the catalyst layer, making a laminated metal layer in an opening or the resist by plating, and finally removing the resist layer and the base metal protected by the resist layer is disclosed in, for example, Patent Literature 1 and Patent Literature 2.

Also, in recent years, a method in which a silver halide diffusion transfer process is employed using a silver halide photosensitive material as a precursor to a conductive material has been proposed. For example, Patent Literature 3, Patent Literature 4, and Patent Literature 5 disclose a technology for making a metal silver pattern on a conductive material precursor having, on an optically transparent base material, a physical development nucleus layer and a silver halide emulsion layer in this order by the action of a soluble silver halide forming agent and a reducing agent in an alkaline fluid. The patterning by this method can reproduce uniform line width. In addition, due to the highest conductivity of silver among all metals, a thinner line with a higher conductivity can be achieved in comparison with other methods, and thus an optically transparent conductive material having a high total light transmittance and a reduced electric resistance can be obtained. An additional advantage is that an optically transparent conductive material obtained by this method has a higher flexibility, i.e., a longer flexing life as compared with an ITO conductive film.

In a projected capacitive touchscreen, two optically transparent conductive materials on each of which a plurality of electrodes are patterned in the same plane are joined together, and the two serve as a touch sensor. While in operation, an operator of a touchscreen usually keeps staring at the display, and therefore if there is a portion in which the total light transmittance is different, the electrode pattern can be recognized (highly visible), causing a problem. In a capacitive touchscreen, an optically transparent material on which electrodes are transversely arranged and another optically transparent material on which electrodes are longitudinally arranged are used in an overlapped state. In this state, the total light transmittance of portions in which upper electrodes and lower electrodes overlap is inevitably reduced, causing the electrode pattern to be seen (highly visible). The electrodes used in a projected capacitive touchscreen comprise relatively large main electrode units in the shape of squares (or diamonds or the like) and relatively small connectors for electrically connecting adjacent main electrode units, and the two kinds are arranged in an alternating manner. Generally, when two optically transparent conductive materials are joined, the smaller connectors are overlapped for the purpose of reducing the areas of different total light transmittance. However, satisfactory effect has not been achieved and further improvement has been desired.

To address this problem, for example, Patent Literature 6 and Patent Literature 7 disclose a conductive sheet in which middle-sized lattices having a pitch n times as long as that of small lattices that constitute large lattices that serve as main electrodes are arranged in a zigzag manner. This technique improves the overlapping between the upper electrodes and the lower electrode. However, in this case, minute blank spots which correspond to gaps between the vertexes of the upper electrode pattern and also to those of the lower electrode pattern exist. As a result, surface roughness of the touchscreen can be felt, and thus further improvement has been desired.

CITATION LIST

Patent Literature

Patent Literature 1: JP 2007-287994 A
Patent Literature 2: JP 2007-287953 A
Patent Literature 3: JP 2003-77350 A
Patent Literature 4: JP 2005-250169 A
Patent Literature 5: JP 2007-188655 A
Patent Literature 6: JP 2011-129501 A
Patent Literature 7: JP 2011-113149 A

SUMMARY OF INVENTION

Technical Problem

An object of the present invention is to provide an optically transparent electrode of which the visibility of the electrode pattern is low (i.e., the electrode pattern is not easily seen by the user of the touchscreen) and therefore is suitable for projected capacitive touchscreens.

Solution to Problem

The above object of the present invention will be achieved by the following inventions.

(1) An optically transparent electrode produced by joining two optically transparent conductive materials each having, on one side of the optically transparent base material, a large lattice formed of a grid-lake conductive pert and a connector which has at least one connector lattice and which electrically connects adjacent large lattices, characterized by that the two optically transparent conductive materials are overlapped so that the centers of the connectors thereof approximately coincide, and by that at least one of the two optically transparent conductive materials has a broken lattice where a part of a thin line is broken and electrical conductivity is lost at a position corresponding to the overlapped connectors and/or to a portion surrounded by the large lattice and the connector.

(2) An optically transparent electrode having, on both sides of an optically transparent base material, a large lattice formed of a grid-like conductive part and a connector which has at least one connector lattice and which electrically connects adjacent large lattices, characterized by that the center of the connecter on one side and the center of the connector on the other side are arranged so as to approximately coincide, and by that at least one side has a broker lattice where a part of a thin line is broken and electrical conductivity is lost at a position corresponding to the overlapped connectors and/or to a portion surrounded by the large lattice and the connector.

(3) The optically transparent electrode according to the above (1), wherein the connectors of the two optically transparent conductive materials are different in site and approximately similar in shape.

(4) The optically transparent electrode according to the above (2), wherein the connector on one side and the connector on the other side of the optically transparent base material are different in size and approximately similar in shape.

(5) The optically transparent electrode according to the above (1) or (2), wherein the difference in aperture ratio between the large lattice formed of a grid-like conductive part and a nonconductive part having the broken lattice where a part of a thin line is broken and electrical conductivity is lost is 1% or lees.

(6) The optically transparent electrode according to the above (1) or (2), wherein the large lattice is formed of a plurality of unit lattices and the interval between the thin lines of the unit lattice is 80 to 120% of the interval between the thin lines of the broken lattice.

Advantageous Effects of Invention

According to the present invention, an optically transparent electrode of which the visibility of the electrode pattern is low (i.e., the electrode pattern is not easily seen by the user of the touchscreen) and therefore is suitable for projected capacitive touchscreens can be provided.

BRIEF DESCRIPTION OF DRAWING

FIG. 1 (a) is a view showing an example of the repeated electrode pattern of large lattices and connectors on one of the two optically transparent conductive materials. FIG. 1 (b) is a view showing an example of the repeated electrode pattern of large lattices and connectors on the other optically transparent conductive material, and FIG. 1 (c) is a view in which an optically transparent conductive material having the electrode pattern of FIG. 1 (a) and an optically transparent conductive material having the electrode pattern of FIG. 1 (b) are overlapped so that the centers of the connectors on one electrode pattern approximately coincide with those on the other.

FIG. 9 (a) and FIG. 9 (b) are views each showing an example of the electrode pattern of a part in which large lattices and the connector are electrically connected, FIG. 9 (c) and FIG. 9 (d) are views each showing an example of the electrode pattern of a part in which large lattices and the connector are not electrically connected, FIG. 9 (e) is an enlarged view of an example of the electrode pattern in which large lattices and the connector are electrically connected, and FIG. 9 (f) is an enlarged view of an example of the electrode pattern in which large lattices and the connector are not electrically connected.

FIG. 10 (a) and FIG. 10 (b) are views each showing an example of the electrode pattern of a part in which large lattices and the connector are electrically connected, and FIG. 10 (c) is a view showing an example of the electrode pattern of a part in which large lattices and the connector are electrically connected.

FIG. 11 (a) and FIG. 11 (b) are views each showing or example of the electrode pattern of a part in which large lattices and the connector are electrically connected, FIG. 11 (c) and FIG. 11 (d) are views each showing an example of the electrode pattern of a part in which large lattices and the connector are not electrically connected, FIG. 11 (e) is a view showing an example of the electrode pattern of a part in which large lattices and a the connector are electrically connected, and FIG. 11 (f) is a view showing an example of the electrode pattern of a part in which large lattices and the connector are not electrically connected.

FIG. 12 (a) and FIG. 12 (b) are views each showing an example of the electrode pattern of a part in which large lattices and the connector are electrically connected, FIG. 12 (c) and FIG. 12 (d) are views each showing an example of the electrode pattern of a part in which large lattices and the connector are not electrically connected, FIG. 12 (e) is a view showing an example of the electrode pattern of a part in which large lattices and the connector are electrically connected, and FIG. 12 (f) is a view showing an example of the electrode pattern of a part in which large lattices and the connector are not electrically connected.

FIG. 13 (a) and FIG. 13 (b) are views each showing an example of the electrode pattern of a part in which large lattices and the connector are electrically connected, FIG. 13 (c) and FIG. 13 (d) are views each showing an example of the electrode pattern of a part in which large lattices and the connector are not electrically connected, FIG. 13 (e) is a view showing an example of the electrode pattern of a part in which large lattices and the connector are electrically connected, and FIG. 13 (f) is a view showing an example of the electrode pattern of a part in which large lattices and the connector are not electrically connected.

FIG. 14 (a) and FIG. 14 (b) are views each showing an example of the electrode pattern of a part in which large lattices and the connector are electrically connected, FIG. 14 (c) and FIG. 14 (d) are views each showing an example of the electrode pattern of a part in which large lattices and the connector are not electrically connected, FIG. 14 (e) is a view showing an example of the electrode pattern of a part in which large lattices and the connector are electrically connected, and FIG. 14 (f) is a view showing an example of the electrode pattern of a part in which large lattices and the connector are not electrically connected.

FIG. 15 (a) is a view of a grid-like electrode pattern without any broken part, and FIGS. 15 (b) to (d) are views showing grid-like electrode patterns having different degrees of line break.

DESCRIPTION OF EMBODIMENTS

First, the optically transparent electrode produced by joining two optically transparent conductive materials each having, on one side of an optically transparent base material, a large lattice formed of a grid-like conductive part and a connector which has at least one connector lattice and which electrically connects adjacent large lattices will be described in detail.

Figure 1:
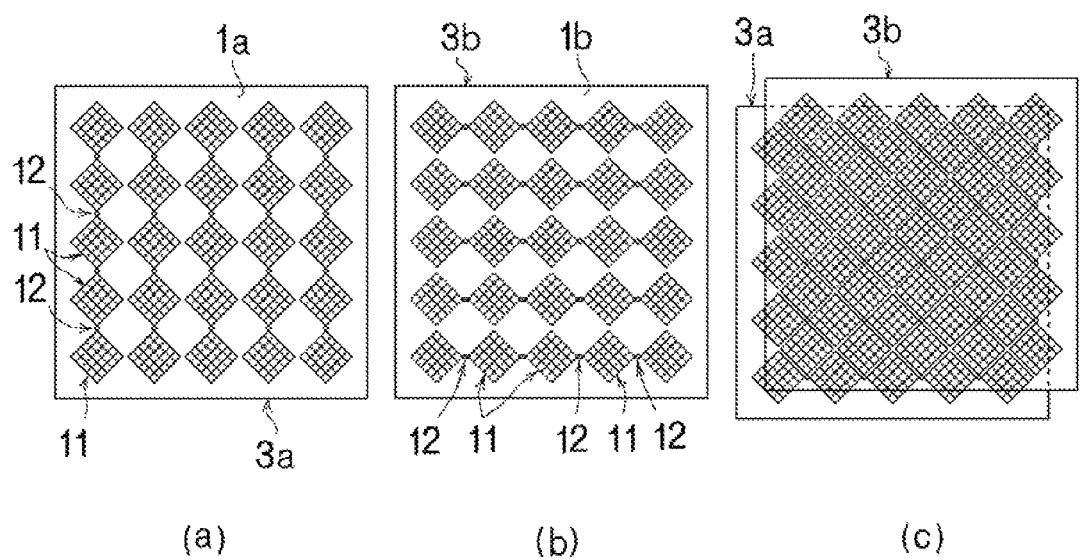
FIGS. 1 (a) to (c) are views each showing an example of the repeated electrode pattern of the optically transparent electrode of the present invention produced by joining two optically transparent conductive materials.

FIGS. 1 (a) to (c) are views each showing an example of the repeated electrode pattern of the optically transparent electrode of the present invention produced by joining two optically transparent conductive materials. FIG. 1 (a) is a view showing an example of the repeated electrode pattern of large lattices and connectors on one of the two optically transparent conductive materials, FIG. 1 (b) is a view showing an example of the repeated electrode pattern of large lattices and connectors on the other optically transparent conductive material, and FIG. 1(c) is a view in which an optically transparent conductive material having the electrode pattern of FIG. 1 (a) and an optically transparent conductive material having the electrode pattern of FIG. 1 (b) are overlapped so that the centers of the connectors on one electrode pattern to approximately coincide with those on the other.

In FIG. 1 (a), large lattices 11 and connectors 12 are provided on an optically transparent base material 1a, and the large lattices 11 each formed of a grid-like conductive part are longitudinally connected via the connectors 12 which electrically connect the large lattices 11. In contrast, in FIG. 1 (b), large lattices 11 each formed of a grid-like conductive part are provided on an optically transparent base material 1b, and are laterally connected via connectors 12 which electrically connect the large lattices 11. In the present invention, an optically transparent electrode suitable for projected capacitive touchscreens can be obtained by joining an optically transparent conductive material 3a having the repeated electrode pattern of large lattices 11 and connectors 12 shown in FIG. 1 (a) and an optically transparent conductive material 3b having the repeated electrode pattern of large lattices 11 and connectors 12 shown in FIG. 1 (b) so that the directions of the two electrode patterns are perpendicular to each other and that the centers of the connectors on one electrode pattern approximately coincide with those on the other. FIG. 1 (c) shows a state in which the optically transparent conductive materials 3a and 3b are overlapped.

Figure 2:
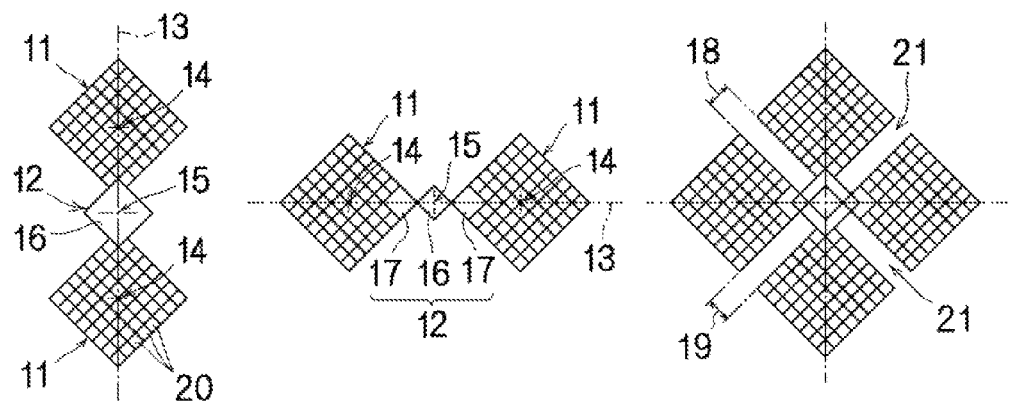
FIG. 2 (a) is an enlarged view of a part of FIG. 1 (a), FIG. 2 (b) is an enlarged view of a part of FIG. 1 (b), FIG. 2 (c) is a view in which the electrode pattern of FIG. 2 (a) and the electrode pattern of FIG. 2 (b) are overlapped so that the centers of the connectors on one electrode pattern approximately coincide with those on the other, FIG. 2 (d) is a view in which a plurality of unit lattices are enlarged, FIG. 2 (e) is a view showing the connector of FIG. 2 (a), FIG. 2 (f) is a view showing the connector of FIG. 2 (b), and FIG. 2 (g) is an enlarged view of a part of FIG. 1 (c).
Figure 2:
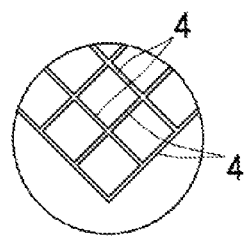
Figure 2:
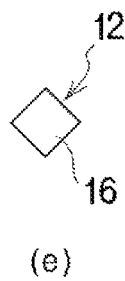
Figure 2:
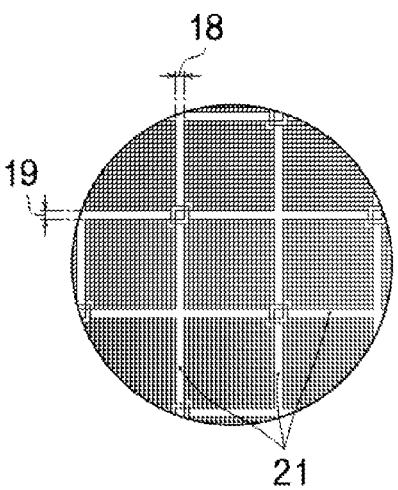
Figure 2:
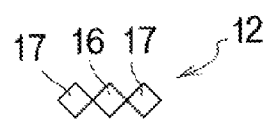

In FIGS. 2 (a) and (b), a large lattice 11 is formed of a plurality of unit lattices 20 arranged in a grid-like structure. Examples of the shape of the unit lattice 20 include triangles, such as an equilateral triangle, an isosceles triangle, and a right triangle; quadrangles, such as a square, a rectangle, a lozenge, a parallelogram, and a trapezoid; (equilateral) polygons, such as an (equilateral) hexagon, an (equilateral) octagon, an (equilateral) dodecagon, and an (equilateral) icosagon; a circle; an ellipse; and a star. One kind of these shapes may be used repeatedly, and alternatively, two or more kinds of these shapes may be used in combination. By combining two or more of such unit lattices 20, a large lattice 11 formed of a grid-like conductive part is formed. Among the above shapes, preferred as the shape of the unit lattice 20 are a square and a lozenge, and the shape of the unit lattice 20 is preferably approximately similar to the outer shape of the large lattice 11. Herein, as described later, "approximately similar" includes the cases where a connector 12 used for electrically connecting large lattices 11 protrude into a large lattice 11 unless the outer shape of the large lattice 11 is thereby changed.

The width of the thin line of the unit lattice 20 is preferably 20 μm or less, and more preferably 1 to 10 μm. Also, the interval between the thin lines of the unit lattice 20 is preferably 500 μm or leas, and more preferably 300 μm or less. Further, the aperture ratio of the large lattice 11 formed of unit lattices 20 is preferably 85% or more, and more preferably 88 to 97%. The width of the thin line of the unit lattice 20 means, when the unit lattice is a square for example, the width of the sides that constitute the square. The interval between the thin lines of the unit lattice 20 means, when the unit lattice is a square for example, the distance between opposite sides. The aperture ratio of the large lattice 11 means the ratio of the area calculated by subtracting the areas of thin lines (see reference sign 4 in FIG. 4) from the total area of all the unit lattices that constitute the large lattice to the total area (including the thin line areas).

In the present invention, the connector 12 may be formed of a connector lattice 16 only as shown in FIG. 2 (*a*), or of a connector lattice 16 and accompanying adjacent lattices 17 as shown in FIG. 2 (*b*). FIG. 2 (*e*) is a view showing only the connector 12 taken from FIG. 2 (*a*) for the illustrative purposes, and FIG. 2 (*f*) is a view showing only the connector 12 taken from FIG. 2 (*b*). In FIG. 2 (*e*), the connector 12 is formed of a connector lattice 16 only, whereas in FIG. 2 (*f*), the connector 12 is formed of a connector lattice 16 and two adjacent lattices 17. In the present invention, any such part as to electrically connect adjacent large lattices 11 and not to belong to large lattices 11 formed of unit lattices 20 is deemed to be included in the connector 12.

Next, the connector lattice 16 will be described. Examples of the shape of the connector lattice 16 include triangles, such as an equilateral triangle, an isosceles triangle, and a right triangle; quadrangles, such as a square, a rectangle, a lozenge, a parallelogram, and a trapezoid; (equilateral) polygons, such as an (equilateral) hexagon, an (equilateral) octagon, an (equilateral) dodecagon, and an (equilateral) icosagon; a circle; an ellipse; a star; a combination thereof; a repeat of one of these; a combination of two or more of these; etc. Among the above shapes, preferred are a square and a lozenge. Also, the shape of the connector lattice 16 is preferably approximately similar to the large lattice 11.

In the present invention, the two optically transparent conductive materials are overlapped so that the centers of the connectors 12 on one electrode pattern approximately coincide with those on the other. In FIGS. 2 (*a*) and 2 (*b*), the center point 15 of the connector most preferably exists on the line 13 connecting the center points of the two adjacent large lattices 11, which are electrically connected by the connector 12, and is located at the middle point between the center points 14 of the two adjacent large lattices 11. The center point 15 of the connector may be off the middle point between the center points 14 of the two adjacent large lattices 11 as long as the distance is 20% or less and preferably 10% or less of the length of one side of the unit lattice 20 which constitutes the large lattices 11. Herein, this state is referred to as "approximately coincide".

The length of one side of the connector lattice 16 is preferably 95 to 105% of the length n times (n is an integer) as long as the length of one side of the unit lattice 20 which constitutes the large lattices 11. As shown in FIG. 2 (*c*), in cases where the length of one side of the connector lattice 16 is longer than the distances 18 and 19 between two adjacent large lattices 11 (for example, as shown in FIG. 2 (*a*)), the connector lattice 16 overlaps into the large lattices 11, where unit lattices overlapped by the connector lattice 16 are deleted. In contrast, in cases where the length of one side of the connector lattice 16 is not longer than the distances 18 and 19 between two adjacent large lattices 11 (for example, as shown in FIG. 2 (*b*)), providing adjacent lattices 17 in contact with the connector lattice 16 is also a preferred embodiment of the present invention. The adjacent lattice 17 is preferably in the shape where one side is m times as long as that of the unit lattice 20 and another side is n times as long as that of the unit lattice 20 (m and n are integers and may be the same or different). The length of one side of the adjacent lattice 17 is preferably 95 to 105% of the length n times (n is an integer) as long as the length of one side of the unit lattice 20 which constitutes the large lattices 11. As shown in FIG. 2 (*b*), in cases where the length of one side of the connector lattice 16 is not longer than the distances 18 and 19 between two adjacent large lattices 11, the adjacent lattices 17 overlaps into the large lattices 11, where unit lattices 20 overlapped by the protruding adjacent lattices 17 are deleted. The widths of the thin lines of the connector lattice 16 and the adjacent lattice 17 are preferably 20 μm or less, more preferably 1 to 10 μm, and further preferably 1 to 2 times as wide as the thin line width of the unit lattice 20. It is also allowable that only one side of the connector lattice 16 and the adjacent lattice 17 or only a part of one side of the connector lattice 16 and the adjacent lattice 17 is widened.

As described above, FIG. 2 (*c*) is a view in which the electrode pattern of FIG. 2 (*a*) and the electrode pattern of FIG. 2 (*b*) are overlapped so that the centers of the connectors thereof approximately coincide. The electrode patterns are overlapped so that the distance between the center point 15 of the connector lattice 15 that comes from FIG. 2 (*a*) and the center point 15 of the connector lattice 16 that comes from FIG. 2 (*b*) is 20% or less and preferably 10% or less of the length of one side of the unit lattice 20 which constitutes the large lattices 11. The size of the connector lattice 16 that comes from FIG. 2 (*a*) and the size of the connector lattice 16 that comes from FIG. 2 (*b*) differ, and such a size difference between the two overlapped connectors is preferable in the present invention. Due to the difference, the visibility of the overlapped electrode patterns can be further reduced (the electrode patterns become more difficult for the user of the touchscreen to see).

As described above, in the electrode pattern (FIG. 1 (*c*)) in which the optically transparent conductive materials 3*a* and 3*b* having the electrode patterns of FIG. 1 (*a*) and FIG. 1 (*b*), respectively are overlapped so that the centers of the connectors 12 on one electrode pattern approximately coincide with those on the other, the portions surrounded by the large lattices 11 and connectors 12 are blank spaces. FIG. 2 (*g*) is an enlarged view of a part of FIG. 1 (*c*), and FIG. 2 (*c*) is a further enlarged view of a part of FIG. 2 (*g*) (see reference sign 21 in FIG. 2 (*c*) and FIG. 2 (*g*)). The blank spaces 21 surrounded by the large lattices 11 and connectors 12 have total light transmittance different from that of the large lattices 11 and therefore are readily noticeable. In this case, it is impossible to obtain an optically transparent electrode of which the visibility is low.

Figure 3:
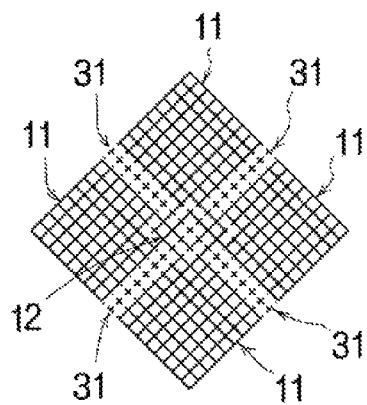
FIG. 3 (a) is a view showing an example of the electrode pattern of FIG. 2 (c) provided with broken lattices, FIG. 3 (b) is a view showing an example of the electrode pattern of FIG. 2 (a) provided with broken lattices, FIG. 3 (c) is a view showing an example of the electrode pattern which comprises two large lattices and which is for obtaining the electrode pattern of FIG. 3 (a), FIG. 3 (d) is a view showing another example of the electrode pattern of FIG. 2 (a) provided with broken lattices, FIG. 3 (e) is a view showing an example of the electrode pattern of FIG. 2 (b) provided with broken lattices, FIG. 3 (f) is a view showing another example of the electrode pattern which comprises two large lattices and which is for obtaining the electrode pattern of FIG. 3 (a), and FIG. 3 (g) is a view showing another example of the electrode pattern of FIG. 2 (b) provided with broken lattices.
Figure 3:
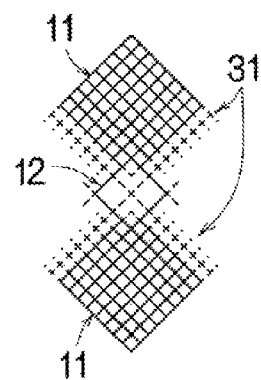
Figure 3:
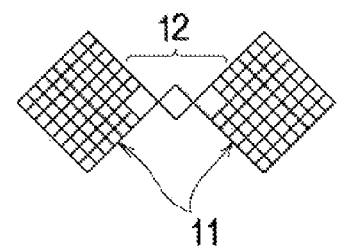
Figure 3:
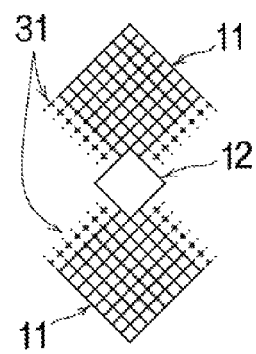
Figure 3:
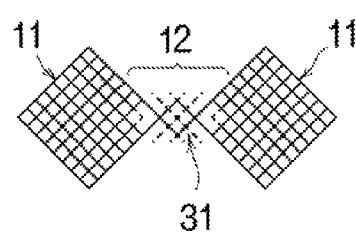
Figure 3:
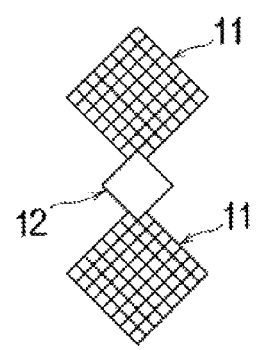
Figure 3:
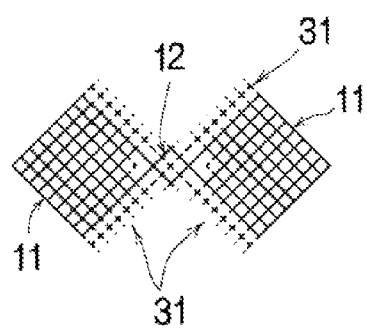
Figure 4:
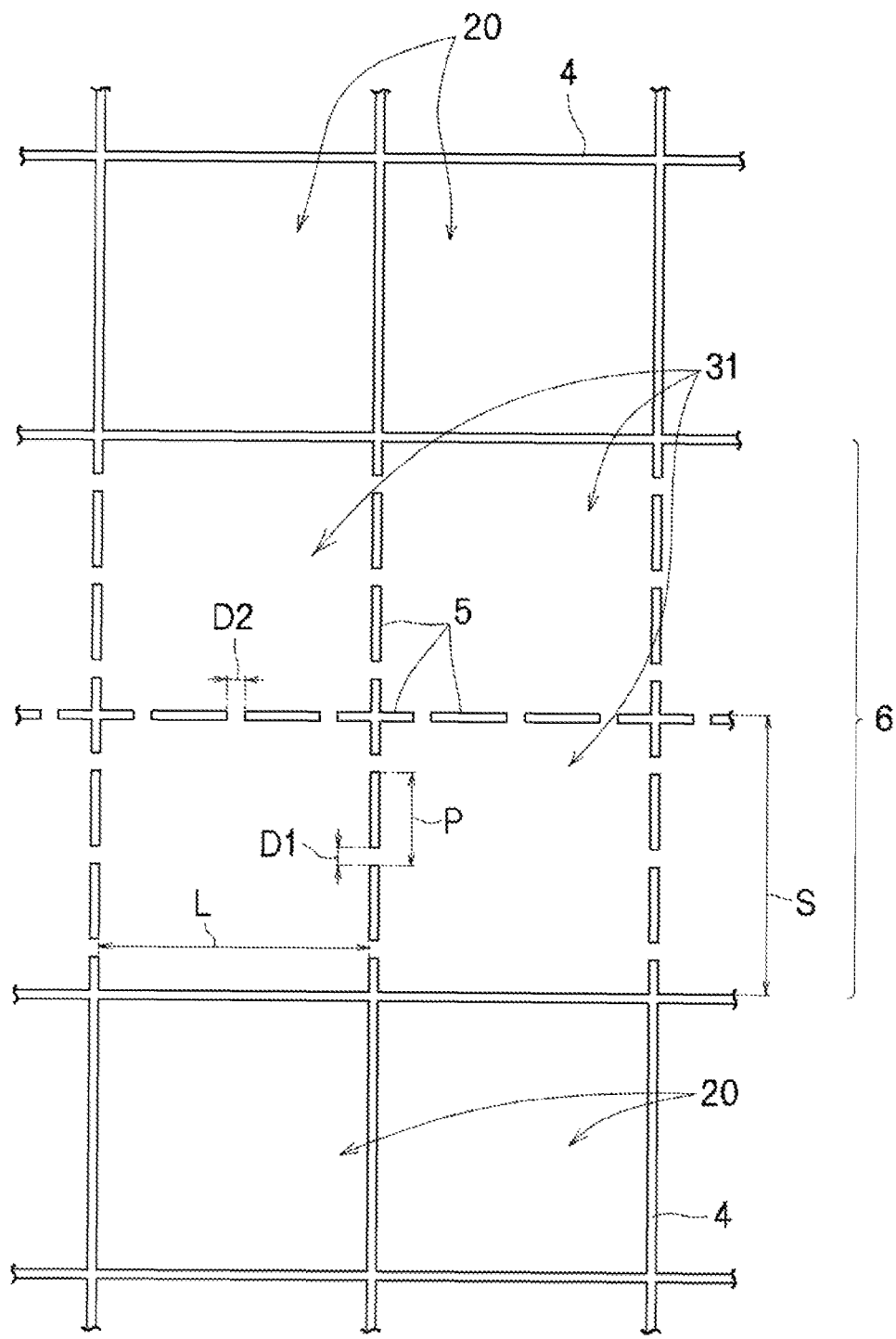
FIG. 4 is an enlarged view of a nonconductive part consisting of broken lattices.

FIG. 3 (*a*) is a view showing an example of the electrode pattern of FIG. 2 (*c*) provided with broken lattices; FIG. 3 (*b*) and FIG. 3 (*d*) are views showing different examples of the electrode pattern of FIG. 2 (*a*) provided with broken lattices, and FIG. 3 (*e*) and FIG. 3 (*g*) are views showing different examples of the electrode pattern of FIG. 2 (*b*) provided with broken lattices. FIG. 4 is an enlarged view of a nonconductive part consisting of broken lattices.

In the present invention, the difference between the aperture ratios of the large lattice 11 formed of multiple unit lattices 20 and of the nonconductive part formed of multiple broken lattices 31 is preferably 1% or less, more preferably 0.78% or less, and particularly preferably 0.5% or less. In the present invention, the aperture ratio is as defined above from specification page 13, line 29 to page 14, line 15. In other words, the aperture ratio is the ratio of the area of a certain portion (for example, the large lattice 11 formed of multiple unit lattices 20 or the nonconductive part formed of multiple broken lattices 31) excluding metal parts therein to the total area of the certain portion. For example, to obtain the electrode pattern of FIG. 3 (*a*), the electrode patterns of FIG. 3 (*b*) and FIG. 3 (*c*) are combined. The pattern of FIG. 3 (*b*) is formed of two large lattices 11 (conductive part) and four nonconductive parts each formed of multiple broken lattices 31, and the pattern of FIG. 3 (*c*) is formed of two large lattices 11 (conductive part). The aperture ratio of the large lattices 11 formed of multiple unit lattices 20 (conductive part) can be calculated as defined above from specification page 13, line 29 to page 14, line 15. The aperture ratio of the nonconductive part formed of multiple broken lattices 31 can be calculated as described below.

The broken lattice is a lattice where a thin line constituting the lattice is broken. In FIG. 4, the nonconductive part 6 is formed of broken lattices 31 formed of broken thin lines 5, the broken lattices 31 existing adjacent to unit lattices 20 where thin lines 4 are continuous. The aperture ratio of the nonconductive part 6 is the ratio of the area of the nonconductive part 6 excluding the broken thin lines 5 to the total area of the nonconductive part 6 including the broken thin lines 5.

It is preferred that the sum of the areas of large lattices 11 of which the difference in aperture ratio from that of the nonconductive part is 1% or less accounts for 80% or more of the sum of the areas of all the large lattices 11 and that the sum of the areas of nonconductive parts of which the differences in aperture ratio from that of the conductive part is 1% or less accounts for 80% or more of the sum of the areas of all the nonconductive parts. In a more preferable embodiment, the aperture ratios of all the large lattices 11 are equal and the aperture ratios of all the nonconductive parts are equal. In the calculation of the above-described aperture ratio, an arbitrarily provided logo part etc. in the electrode pattern is ignored.

In the case where the unit lattices of the large lattices 11 and the nonconductive parts are in the same shape and the Nonconductive parts have broken lattices 31, the aperture ratio of the nonconductive parts is higher because the broken lattices are formed of broken thin lines. To limit the difference in aperture ratio between the large lattices 11 and the nonconductive parts to 1% or less, a method in which the increase in the opening area ratio due to broken parts is suppressed by reducing the ratio of line breaks in the nonconductive parts, a method in which the increase in the aperture ratio due to broken lattices 31 is compensated by using different shapes of unit lattices 20 for the large lattices 11 and the nonconductive parts (the large lattices 11 are formed of unit lattices 20 with a higher aperture ratio) etc. can be employed.

The broken lattices 31 (indicated by broken lines in FIG. 3) are formed of thin lines 5 which are partially and electrically broken. The broken part may be formed in any manner as long as it serves to electrically disconnect any two large lattices 11, a connector 12 and a different connecter 12, or a large lattice 11 and a connector 12. The degree of line break is defined as the ratio of broken parts per broken lattice, regardless of the length or each broken part. In the case where a broken part extends across two or more broken lattices, the broken part is counted as one divided by the number of lattices which share the broken part. In the case where broken parts are not evenly distributed to each unit graphic, the degree of line break is defined as the average degree for a minimum repeating unit in which a regular repeating of unit graphics including broken parts is observed.

Figure 15:
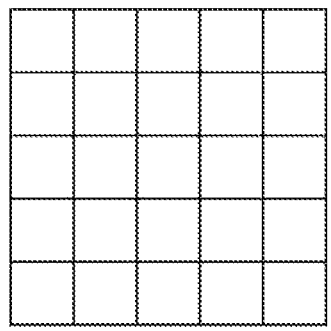
FIG. 15 illustrates degrees of line break.
Figure 15:
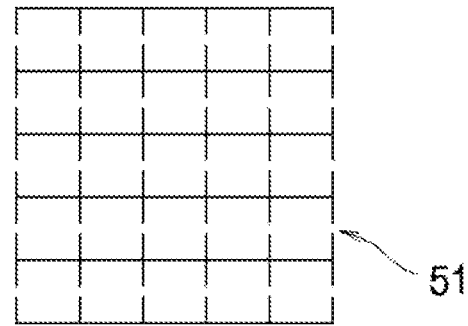
Figure 15:
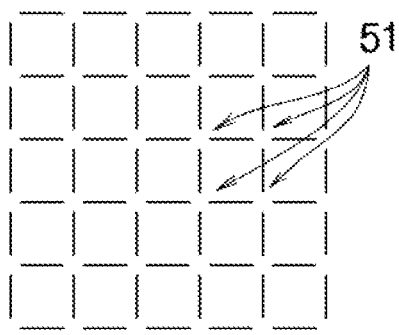
Figure 15:
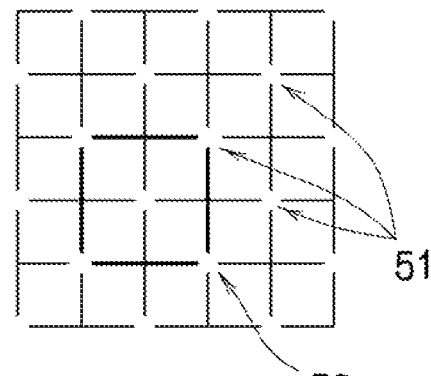
Figure 16:
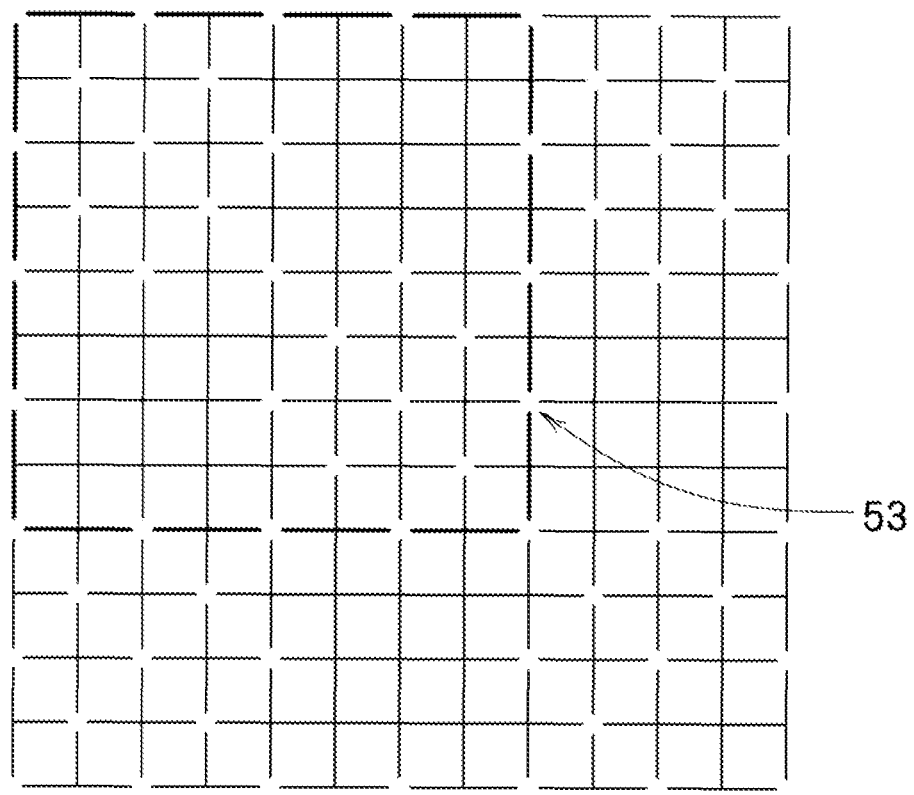
FIG. 16 illustrates a degree of line break.

FIG. 15 illustrates degrees of line break. FIG. 15 (*a*) is a view of a grid-like electrode pattern without any broken part, and FIGS. 15 (*b*) to (*d*) are views showing grid-like electrode patterns having different degrees of line break. Since FIG. 15 (*a*) is a grid-like electrode pattern without any broken part, the degree of line break is 0%. In the case of FIG. 15 (*b*), two broken parts 51 are found in a unit graphic (square), and each line break 51 is shared by two unit graphics (½ line break per unit graphic). Therefore, the degree of line break is (½)×2=100%. In the case of FIG. 15 (*c*), four line breaks are found at four corners of each unit graphic, and each line break 51 is shared by four unit graphics (¼ line break per unit graphic). Therefore, the degree of line break is (¼)×4=100%. In the case of FIG. 15 (*d*), 5×5 unit graphics (squares) forms a grid-like pattern, but the pattern of the line break 51 is not the same in all the unit graphics. In this case, a square part 52 enclosed by a thick line is repeated, and four ¼ broken parts and one broken part are found in the square part 52 formed of four unit graphics. Therefore, the degree of line break is ((¼)×4+1×1)/4=50%. FIG. 16 also illustrates a degree of line break, where a square part 53 which is formed of unit squares and which has a specified line break pattern is repeated. In this case, the degree of line break is (¼×4+½×12+1×15)/64=34.375%.

In the present invention, the degree of line break in the nonconductive part is preferably 20% or more. The sheet resistance of the nonconductive part is 10 KΩ or more per square, preferably 1 MΩ or more per square, and more preferably 1 GΩ or more per square as measured by the four-terminal method (JIS K7134, terminal interval: 5 mm). In other words, so-called insulators are preferred.

The width of the thin line of the broken lattice 31 in the nonconductive part (the width of the broken thin lines 5 in FIG. 4) is preferably 20 μm or less, and more preferably 1 to 10 μm. Also, the interval between the thin lines of the broken lattice 31 (see sign L in FIG. 4) is preferably 500 μm or less, and more preferably 300 μm or less. The length of the broken part of the broken lattice 31 (see signs D1 and D2 in FIG. 4) is preferably 30 μm or less, and more preferably 15 μm or less. The line break may be perpendicular to the thin line, or obliquely crossed. Also, the interval between the thin lines of the unit lattice 20 is preferably 80 to 120% of the interval between the thin lines of the broken lattice 31. When two optically transparent conductive materials are overlapped, the differences in the aperture ratio of the large lattice 11, the aperture ratio of the connector 12, and the aperture ratio of the broken lattice 31 between the two materials are preferably all within 1%.

There are many methods for obtaining an electrode pattern as shown in FIG. 3 (*a*) described above when two optically transparent conductive materials are overlapped. Examples of the method include a method in which the electrode pattern of FIG. 3 (*b*) and the electrode pattern of FIG. 3 (*c*) are overlapped so that they approximately coincide, a method in which the electrode pattern or FIG. 3 (*d*) and the electrode pattern of FIG. 3 (*e*) are overlapped so that they approximately coincide, and a method in which the electrode pattern of FIG. 3 (*f*) and the electrode pattern of FIG. 3 (g) are overlapped so that they approximately coincide. As shown in these examples, it is preferred that the broken lattices 31 (lattices having broken parts) are formed so that two broken lattices do not overlap and in a size from 95 to 105% of the unit lattices 20 which form large lattices 11 when two optically transparent conductive materials are overlapped.

Figure 5:
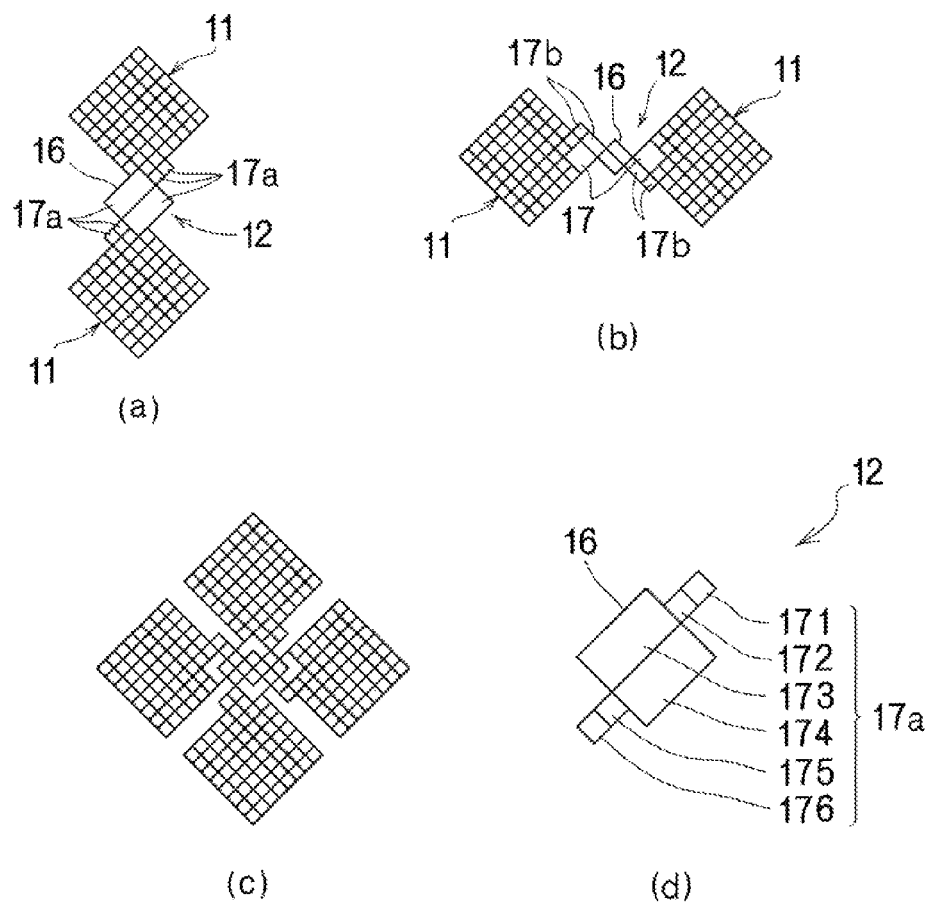
FIG. 5 (a) is a view showing an example of the electrode pattern of FIG. 2 (a) provided with adjacent lattices, FIG. 5 (b) is a view showing an example of the electrode pattern of FIG. 2 (b) provided with adjacent lattices, FIG. 5 (c) is a view in which the electrode pattern of FIG. 5 (a) and the electrode pattern of FIG. 5 (b) are overlapped so that the centers of the connectors thereof approximately coincide, and FIG. 5 (d) is an enlarged view of the connector of FIG. 5 (a).

FIGS. 5 (a) to (c) are views showing electrode patterns having adjacent lattices, where broken lattices are omitted for the sake of simplicity. FIG. 5 (a) is a view showing an example of the electrode pattern of FIG. 2 (a) provided with adjacent lattices 17a, FIG. 5 (b) is a view showing an example of the electrode pattern of FIG. 2 (b) provided with adjacent lattices 17b, and FIG. 5 (c) is a view in which the electrode pattern of FIG. 5 (a) and the electrode pattern of FIG. 5 (b) are overlapped so that the centers of the connectors thereof approximately coincide. As shown in these examples, adjacent lattices are provided for the connector 12 to connect two adjacent large lattices 11 via multiple pathways. Therefore, it is preferred that an adjacent lattice is provided in contact with a connector lattice 16 and another adjacent lattice, with a connector lattice 16 and a large lattice 11, or with other two adjacent lattices. The adjacent lattice may be provided so as to protrude into a connector lattice 16 or another adjacent lattice. FIG. 5 (d) is a view showing only the connector 12 taken from FIG. 5 (a) for the illustrative purposes. As shown in FIG. 5 (d), an adjacent lattice 17a consists of six adjacent lattices in total, from 171 to 176. An adjacent lattice 171 is provided in contact with a large lattice 11 (not shown) and another adjacent lattice 172. The adjacent lattice 172 is provided in contact with the adjacent lattice 171, a large lattice 11 (not shown), and another adjacent lattice 173. The adjacent lattice 173 and an adjacent lattice 174 together constitute a connector lattice 16. The former contacts with a large lattice 11 (not shown) and the adjacent lattice 172, and the latter contacts with a large lattice 11 (not shown) and an adjacent lattice 175. The adjacent lattice 175 is provided in contact with the adjacent lattice 174, a large lattice 11 (not shown), and another adjacent lattice 176. The adjacent lattice 176 is provided in contact with the adjacent lattice 175 and a large lattice 11 (not shown).

As shown in the electrode pattern of FIG. 5 (c) in which the electrode pattern of FIG. 5 (a) and the electrode pattern of FIG. 5 (b) are overlapped, it is preferred that an adjacent lattice 17a provided in one electrode pattern and an adjacent lattice 17b provided in the other electrode pattern are not overlapped with each other. The reason is that the total light transmittance of the portion in which two electrode patterns are overlapped is reduced, causing the electrode pattern as a whole to be easily seen. The widths of the thin lines and the intervals between the thin lines of the adjacent lattices 17a and 17b are preferably in the ranges described in paragraph above from specification page 13, line 29 to page 14, line 15.

Figure 6:
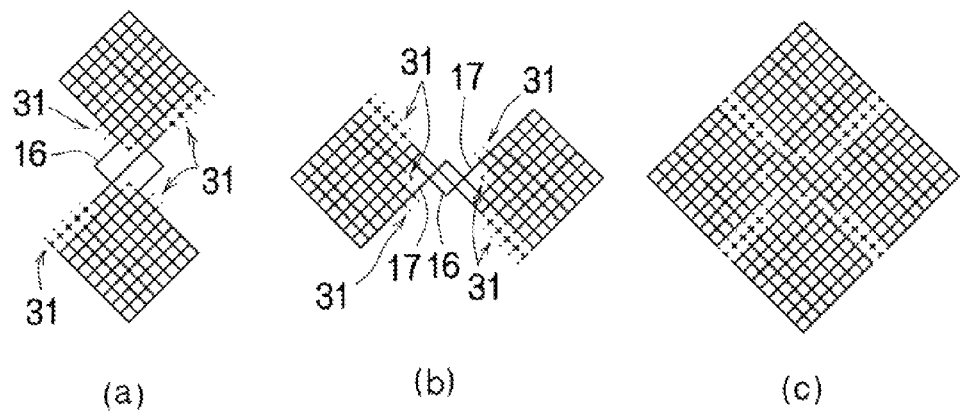
FIGS. 6 (a) to (c) are views each showing an example of the electrode pattern of FIGS. 5 (a) to (c) provided with broken lattices, respectively.

FIGS. 6 (a) to (c) are views each showing an example of the electrode pattern of FIGS. 5 (a) to (c) to which broken lattices are added. The electrode pattern of FIG. 6 (c) where no two lines are overlapped can be produced by overlapping the electrode pattern of FIG. 6 (a) and the electrode pattern of FIG. 6 (b).

Figure 7:
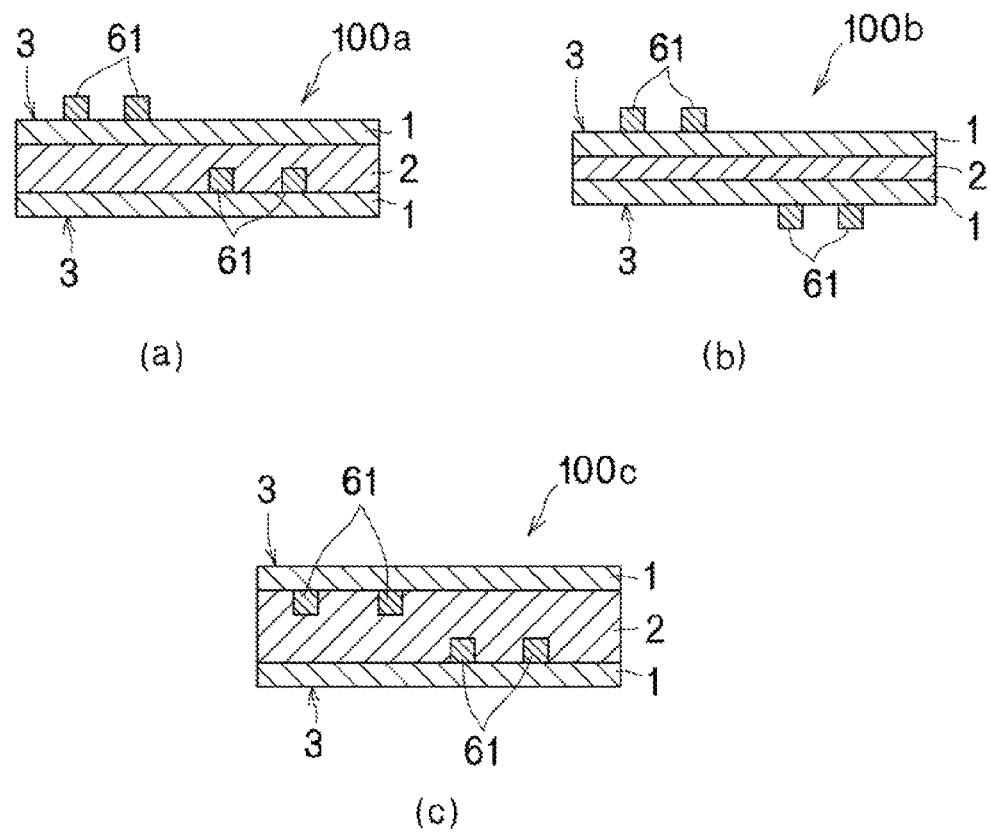
FIGS. 7 (a) to (c) are schematic views showing cross-sections of three different examples of the optically transparent electrode of the present invention comprising two optically transparent conductive materials.

FIGS. 7 (a) to (c) are schematic views showing cross-sections of three different examples of the optically transparent electrode of the present invention comprising two optically transparent conductive materials. The optically transparent electrodes 100a to 100c of the present invention are produced by overlapping two optically transparent conductive materials 3 via an intermediate adhesive layer 2. 1 is an optically transparent base material. As the adhesive constituting the adhesive layer 2, publicly known adhesives can be used, and examples thereof include known adhesives, such as acrylic adhesives and urethane adhesives; thermoplastic resins, such as EVA and PVB; urethane hot-melt adhesives; thermosetting resins, such as epoxy resins and thermosetting urethane resins; ultraviolet curable resins, such as acrylic ultraviolet curable resins and epoxy ultraviolet curable resins, etc. The mating faces of the two optically transparent conductive materials 3 may be any of the following combinations: as shown in FIG. 7 (a), the backside (not having a conductive part 61) of one optically transparent conductive material faces the frontside (having conductive parts 61) of the other optically transparent conductive material; as shown in FIG. 7 (b), the backsides face each other; and as shown in FIG. 7 (c), the frontside faces the frontside of the other.

As the optically transparent base material used for the optically transparent conductive material of the present invention, plastics, glass, rubber, ceramics, etc. are preferably used. Preferred are optically transparent base materials having total light transmittance of 60% or more. Among plastics, flexible resin films are preferably used because of excellent ease in handling. Specific examples of the resin films used as the optically transparent base material include resin films made of a polyester resin, such as polyethylene terephthalate (PET) and polyethylene naphthalate (PEN), an acrylate resin, an epoxy resin, a fluorine resin, a silicone resin, a polycarbonate resin, a diacetate resin, a triacetate resin, a polyarylate resin, a polyvinyl chloride, a polysulfone resin, a polyether sulfone resin, a polyimide resin, a polyamide resin, a polyolefin resin, a cyclic polyolefin resin, etc., and the thickness is preferably 50 to 300 μm. The optically transparent base material may be provided with a publicly known layer, such as an easily adhering layer. Further, the optically transparent base material may be provided with a publicly known layer, such as a physical development nuclei layer.

The conductive part 61 is preferably made of a metal, in particular, gold, silver, copper, nickel, aluminum, and a composite material thereof. As the method for making the conductive parts 61, a publicly known method can be used, and the examples thereof include a method in which a silver halide photosensitive material is used, a method in which, after the above use, non-electrolytic plating or electrolytic plating of the obtained silver image is performed, a method in which screen printing with use of a conductive ink, such as a silver paste, is performed, a method in which inkjet printing with use of a conductive ink, such as a silver ink, is performed, a method in which a conductive layer made of a metal, such as copper, is formed by non-electrolytic plating etc., a method in which the conductive part is obtained by making a conductive layer by evaporation coating or sputtering, making a resist film thereon, exposing, developing, etching, and removing the resist layer, and a method in which the conductive part is obtained by placing a metal foil, such as a copper foil, making a resist film thereon, exposing, developing, etching, and removing the resist layer. Inter alia, a silver halide diffusion transfer process is preferably used because a thin conductive part 61 can be obtained and the line width of the conductive part 61 can be easily thinned. The silver halide diffusion transfer process is described in, for example, JP 2003-77350 A and JP 2005-250169 A. If the thickness of the conductive part 61 produced by these procedures is too thin, the conductivity required of touch-screens can hardly be achieved. Therefore, the thickness is preferably 0.05 to 5 μm, and more preferably 0.1 to 1 μm.

In the present invention, the optically transparent conductive material 3 may be provided with, in addition to the optically transparent base material 1 and the conductive part 61 thereon, a publicly known layer, such as a hard coating layer, an antireflection layer, an adhesive layer, an antiglare layer, etc. on the electrode pattern (on the distant side from the optically transparent base material 1) or on the optically transparent base material 1 (on the opposite side to the electrode pattern).

Next, an optically transparent electrode produced so that the optically transparent base material has, on both sides thereof, a large lattice formed of a grid-like conductive part and a connector which electrically connects adjacent large lattices and that the connectors on the front side overlap those on the back side will be described.

Figure 8:
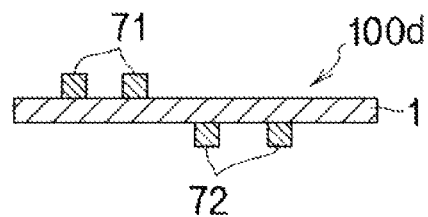
FIG. 8 is a schematic view showing a cross-section of an example of the optically transparent electrode of the present invention comprising one optically transparent conductive material.

FIG. 8 is a schematic view showing a cross-section of an example of the optically transparent electrode of the present invention comprising one optically transparent conductive material. In the optically transparent electrode 100d of the present invention, as the optically transparent base material 1, an optically transparent base material similar to the one employed in the optically transparent electrode produced by overlapping two optically transparent conductive materials (hereinafter referred to as double-deck electrode) can be used. As with the case of the double-deck electrode, the optically transparent base material 1 may be provided with a publicly known layer, such as a physical development nuclei layer, an easily adhering layer, and an adhesive layer.

In FIG. 8, the conductive parts 71 and 72 are preferably made of a metal, in particular, gold, silver, copper, nickel, aluminum, and a composite material thereof. As the method for making the conductive parts 71, a method similar to those for the conductive parts 61 is used. Inter alia, a silver halide diffusion transfer process is preferably used because thin conductive parts 71 and 72 can be obtained and the line width of the conductive parts 71 and 72 can be easily thinned. However, unlike the double-deck electrode, a single-deck electrode having only one optically transparent base material 1 needs to be provided with conductive parts on both sides thereof. This can be achieved by producing conductive parts 71 on one side by the above silver halide diffusion transfer process and subsequently producing conductive parts 72 on the other side by the same method or another publicly known method. In particular, methods comprising an exposure step, such as a method in which the conductive part is obtained by making a conductive layer by evaporation coating or sputtering, making a resist film thereon, exposing, developing, etching, and a removing the resist layer, a method in which the conductive part is obtained by placing a metal foil, such as a copper foil, making a resist film thereon, exposing, developing, etching, and removing the resist layer, and a method in which a silver halide diffusion transfer process is used, and a method in which black and white silver halide photograph is used, are preferred because the relative positional accuracy of the upper and lower sides can be increased with use of a pin bar at the exposure step. If the thickness of the conductive parts 71 and 72 produced by these procedures is too thin, the conductivity required of touchscreens can hardly be achieved. Therefore, the thickness is preferably 0.05 to 5 µm, and more preferably 0.1 to 1 µm.

The optically transparent electrode 100d of FIG. 8 may be provided with, in addition to the optically transparent base material 1 and the conductive parts 71 and 72 thereon, a publicly known layer, such as a hard coating layer, an antireflection layer, an adhesive layer, an antiglare layer, etc. on the electrode patterns (on the distant side from the optically transparent base material 1).

EXAMPLES

Hereinafter, the present invention will be illustrated in more detail by Examples, but the present invention is not limited thereto.

Example 1

As an optically transparent base material, a 100-µm-thick polyethylene terephthalate film was used. The total light transmittance of this optically transparent base material was 91%.

Next, in accordance with the following formulation, a physical development nuclei coating liquid was prepared, applied onto the optically transparent base material, and dried to provide a physical development nuclei layer.
<Preparation of Palladium Sulfide Sol>

| Liquid A | Palladium chloride | 5 g |
| | Hydrochloric acid | 40 mL |
| | Distilled water | 1000 mL |
| Liquid B | Sodium sulfde | 8.6 g |
| | Distilled water | 1000 mL |

Liquid A and Liquid B were mixed with stirring for 30 minutes, and then passed through a column filled up with an ion exchange resin to give a palladium sulfide sol.
<Preparation of Physical Development Nuclei Coating Liquid (Per $m^2$ of Optically Transparent Base Material)>

| | |
|---|---|
| The above-prepared palladium sulfide sol | 0.4 mg |
| 2 mass % glyoxal aqueous solution | 0.2 mL |
| Surfactant (S-1) | 4 mg |
| Denacol EX-830 | 50 mg |
| (Polyethylene glycol diglycidyl ether made by Nagase Chemtex Corp.) | |
| 10 mass % SP-200 aqueous solution | 0.5 mg |
| (Polyethyleneimine made by Nippon Shokubai Co., Ltd.; average molecular weight 10,000) | |

Subsequently, an intermediate layer, a silver halide emulsion layer, and a protective layer, of which the compositions are shown below, were applied in this order (from closest to the optically transparent base material) onto the above physical development, nuclei layer, and dried to give a silver halide photosensitive material 1. The silver halide emulsion was produced by a general double jet mixing method for photographic silver halide emulsions. The silver halide emulsion was prepared using 95 mol % of silver chloride and 5 mol % of silver bromide so as to have an average particle diameter of 0.15 µm. The obtained silver halide emulsion was subjected to gold and sulfur sensitization using sodium thiosulfate and chloroauric acid by the usual method. The silver halide emulsion obtained in this way contains 0.5 g of gelatin per gram of silver.
<Composition of Intermediate Layer (per $m^2$ of Optically Transparent Base Material)>

| | |
|---|---|
| Gelatin | 0.5 g |
| Surfactant (represented by Chemical Formula (1) below) | 5 mg |
| Dye (represented by Chemical Formula (2) below) | 0.1 g |

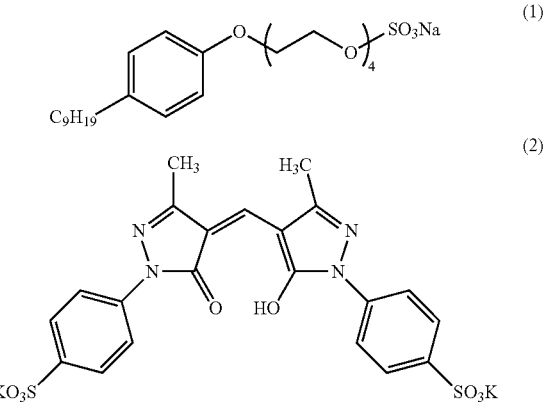

<Composition of Silver Halide Emulsion Layer (per m² of Optically Transparent Base Material)>

| | |
|---|---|
| Gelatin | 0.5 g |
| Silver halide emulsion | equivalent of 3.0 g of silver |
| 1-Phenyl-5-mercaptotetrazole | 3 mg |
| Surfactant (represented by the above Chemical Formula (1)) | 20 mg |

<Composition of Protective Layer (per m² of Optically Transparent Base Material)>

| | |
|---|---|
| Gelatin | 1 g |
| Infinite form silica mat agent (average particle diameter: 3.5 μm) | 10 mg |
| Surfactant (represented by the above Chemical Formula (1)) | 10 mg |

Figure 9:
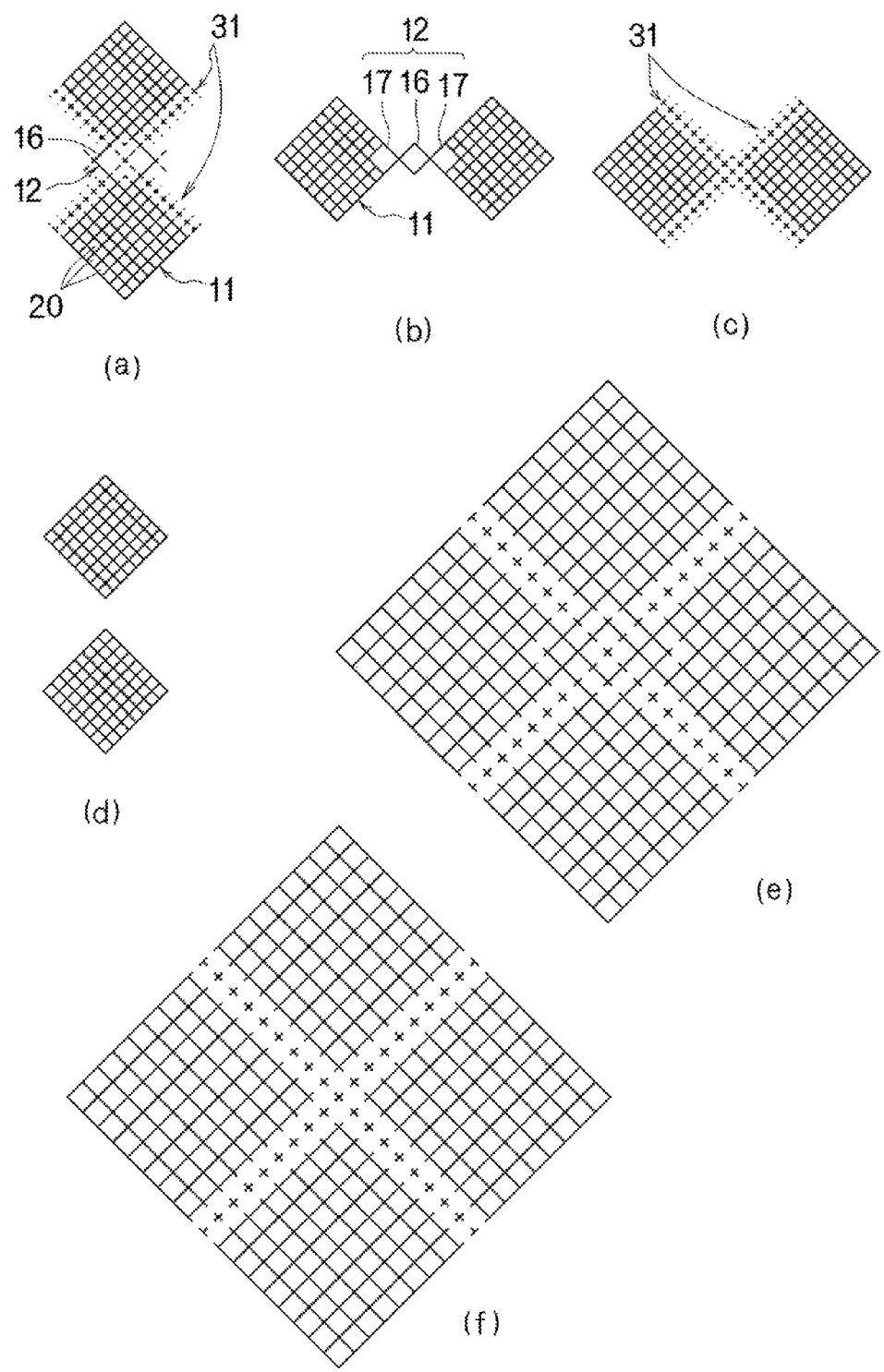
FIG. 9 shows electrode patterns of Example 1.

A transparent manuscript A1 having the electrode pattern of FIG. 1(a), in particular, having the electrode pattern of FIG. 9(a) in parts in which large lattices 11 and the connector 12 are electrically connected, and the electrode pattern of FIG. 9(c) in parts in which large lattices 11 and the connector 12 are not electrically connected; and a transparent manuscript B1 having the electrode pattern of FIG. 1(b), in particular, having the electrode pattern of FIG. 9(b) in parts in which large lattices 11 and the connector 12 are electrically connected, and the electrode pattern of FIG. 9(d) in parts in which large lattices 11 and the connector 12 are not electrically connected were separately prepared.

In the transparent manuscripts A1 and B1, the large lattice 11 is formed of unit lattices 20 each of which consists of a 0.25-mm square, the large lattice 11 itself is a 5-mm square, and the large lattice 11 and the unit lattice 20 are formed of thin lines 7 μm in width. The broken lattice 31 is a 0.25-mm square (see sign S in FIG. 4), and the broken lattice 31 is formed of thin lines 8 μm in width. The broken lattice 31 has a 10-μm line break (see sign D1 in FIG. 4) in every 67.5 μm (see sign P in FIG. 4). In this broken lattice 31, the length of the line break corresponding to the sign D2 in FIG. 4 is 10 μm.

The connector 12 of the transparent manuscript A1, as shown in FIG. 9(a), consists only of a connector lattice 16, which is a 1-mm square (line width: 7 μm). In contract, the connector 12 of the transparent manuscript B1, as shown in FIG. 9(b), consists of a connector lattice 16, which is a 0.5-mm square (line width: 7 μm), and two adjacent lattices 17, which are in the similar square form.

The surface of the silver halide emulsion layer of the silver halide photosensitive material 1 obtained as above was brought into close contact with the electrode pattern surface of the transparent manuscript A1, and exposure was performed, through a resin filter which cuts off light of wavelength below 400 nm, using a contact printer having a mercury lamp as a light source. Also, the surface or the silver halide emulsion layer of the silver halide photosensitive material 1 was brought into close contact with the electrode pattern surface of the transparent manuscript B1, and exposure was performed in the same manner. In other Examples and Comparative Examples described later, the surfaces brought into close contact at the time of exposure are the same as in Example 1.

After immersion in the diffusion transfer developer shown below at 20° C. for 60 seconds, the silver halide emulsion layer, the intermediate layer, and the protective layer were washed off with warm water at 40° C. to give an optically transparent conductive material 1a having a silver pattern the same as the electrode pattern of A1 and an optically transparent conductive material 1b having a silver pattern the same as the electrode pattern of B1. The obtained optically transparent conductive materials 1a and 1b had the same line width and the same line interval as those of the transparent manuscripts A1 and B1, respectively, and the aperture ratio of large lattice 11 was 94.5%. As for line breaks, the above transparent manuscripts A1 and B1 have broken lattices of which the degree of line break is 600%, broken lattices of which the degree of line break is 700%, and broken lattices of which the degree of line break is 800%, and the aperture ratios thereof are 94.5%, 94.6%, and 94.7%, respectively. Therefore, in this Example, the difference in aperture ratio between the large lattice formed of a grid-like conductive part and the nonconductive part having a broken lattice where a part of a thin line is broken and electrical conductivity is lost was not more than 0.2%.

<Composition of Diffusion Transfer Developer>

| | |
|---|---|
| Potassium hydroxide | 25 g |
| Hydroquinone | 18 g |
| 1-Phenyl-3-pyrazolidone | 2 g |
| Potassium sulfite | 80 g |
| N-methylethanol amine | 15 g |
| Potassium bromide | 1.2 g |

All the above were dissolved in 1000 mL of water, and the pH was adjusted to 12.2.

The obtained optically transparent conductive materials 1a and 1b were taped together with use of MHM-FW25 (a two-sided adhesive tape without base material made by Nichiei Kakoh Co., Ltd.) so that the centers of the connectors on one electrode pattern coincided with those on the other and that the optically transparent conductive materials overlapped as shown in FIG. 7 (a) to give an optically transparent electrode 1. Regarding the optically transparent electrode 1, FIG. 9 (e) is an enlarged view showing an electrode pattern in which large lattices 11 and the connector 12 are electrically connected, and FIG. 9 (f) is an enlarged view showing an electrode pattern in which large lattices 11 and the connector 12 are not electrically connected.

Example 2

Figure 10:
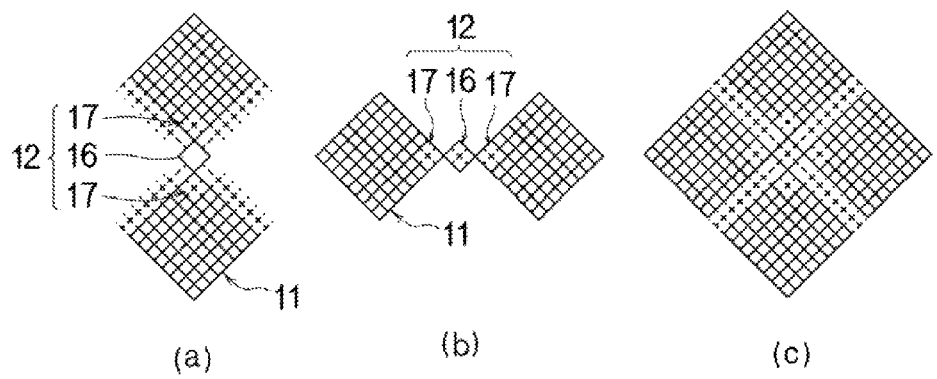
FIG. 10 shows electrode patterns of Example 2.

An optically transparent electrode 2 was obtained in the same manner as in Example 1 except that a transparent manuscript A2 having the electrode pattern of FIG. 10(a) in parts in which large lattices 11 and the connector 12 are electrically connected, and the electrode pattern of FIG. 9(c) in parts in which large lattices 11 and the connector 12 are not electrically connected; and a transparent manuscript B2 having the electrode pattern of FIG. 10(b) in parts in which large lattices 11 and the connector 12 are electrically connected, and the electrode pattern of FIG. 9(d) in parts in which large lattices 11 and the connector 12 are not electrically connected were used.

In the transparent manuscripts A2 and B2, the unit lattice 20 and the broken lattice 31 have the same line width, the same line interval, and the same line breaks as those of the unit lattice 20 and the broken lattice 31 in the transparent manuscripts A1 and B1.

The connector 12 of the transparent manuscript A2 consists of a connector lattice 16, which is a 0.5-mm square (line width: 7 μm), and two adjacent lattices 17, which are in the similar square form. The connector 12 of the transparent manuscript B2 consists of a connector lattice 16, which is a 0.5-mm square (line width: 7 μm), and two adjacent lattices 17, which are in the similar square form. Regarding the optically transparent electrode 2, FIG. 10 (c) is a view showing an electrode pattern in which large lattices 11 and the connector 12 are electrically connected, and FIG. 9 (f) is an enlarged view showing an electrode pattern in which large lattices 11 and the connector 12 are not electrically connected. In this Example, the difference in aperture ratio between the large lattice formed of a grid-like conductive part and the nonconductive part having a broken lattice where a part of a thin line is broken and electrical conductivity is lost was similar to that in Example 1.

Example 3

Figure 11:
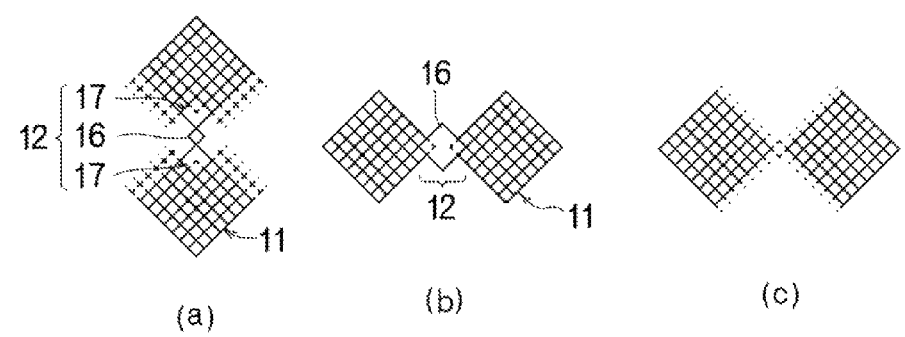
FIG. 11 shows electrode patterns of Example 3.
Figure 11:
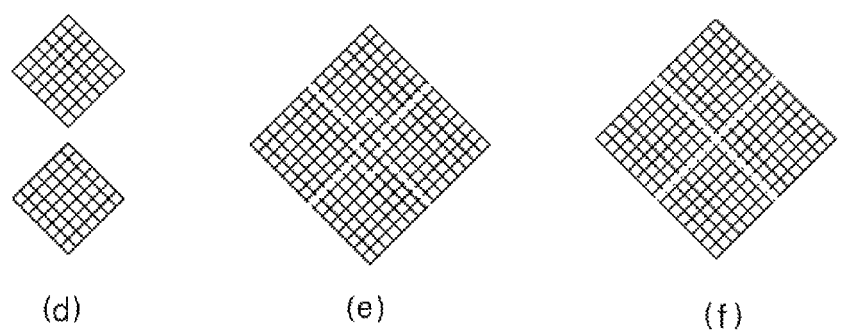

An optically transparent electrode 3 was obtained in the same manner as in Example 1 except that a transparent manuscript A3 having the electrode pattern of FIG. 11(a) in parts in which large lattices 11 and the connector 12 are electrically connected, and the electrode pattern of FIG. 11(c) in parts in which large lattices 11 and the connector 12 are not electrically connected; and a transparent manuscript B3 having the electrode pattern of FIG. 11(b) in parts in which large lattices 11 and the connector 12 are electrically connected, and the electrode pattern of FIG. 11 (d) in parts in which large lattices 11 and the connector 12 are not electrically connected were used.

In the transparent manuscripts A3 and B3, the unit lattice 20 and the broken lattice 31 have the same line width, the same line interval, and the same line breaks as those of the unit lattice 20 and the broken lattice 31 in the transparent manuscripts A1 and B1.

The connector 12 of the transparent manuscript A3 consists of a connector lattice 16, which is a 0.25-mm square (line width: 7 μm), and two adjacent lattices 17, which are: 0.5-mm squares (line width: 7 μm) adjacent to the connector lattice 16. In contrast, the connector 12 of the transparent manuscript B3 consists only of a connector lattice 16, which is a 0.75-mm square (line width: 7 μm). Regarding the optically transparent electrode 3, FIG. 11 (e) is a view showing an electrode pattern in which large lattices 11 and the connector 12 are electrically connected, and FIG. 11 (f) is a view shoving an electrode pattern in which large lattices 11 and the connector 12 are not electrically connected. In this Example, the difference in aperture ratio between the large lattice formed of a grid-like conductive part and the nonconductive part having a broken lattice where a part of a thin line is broken and electrical conductivity is lost was similar to that in Example 1.

Example 4

Figure 12:
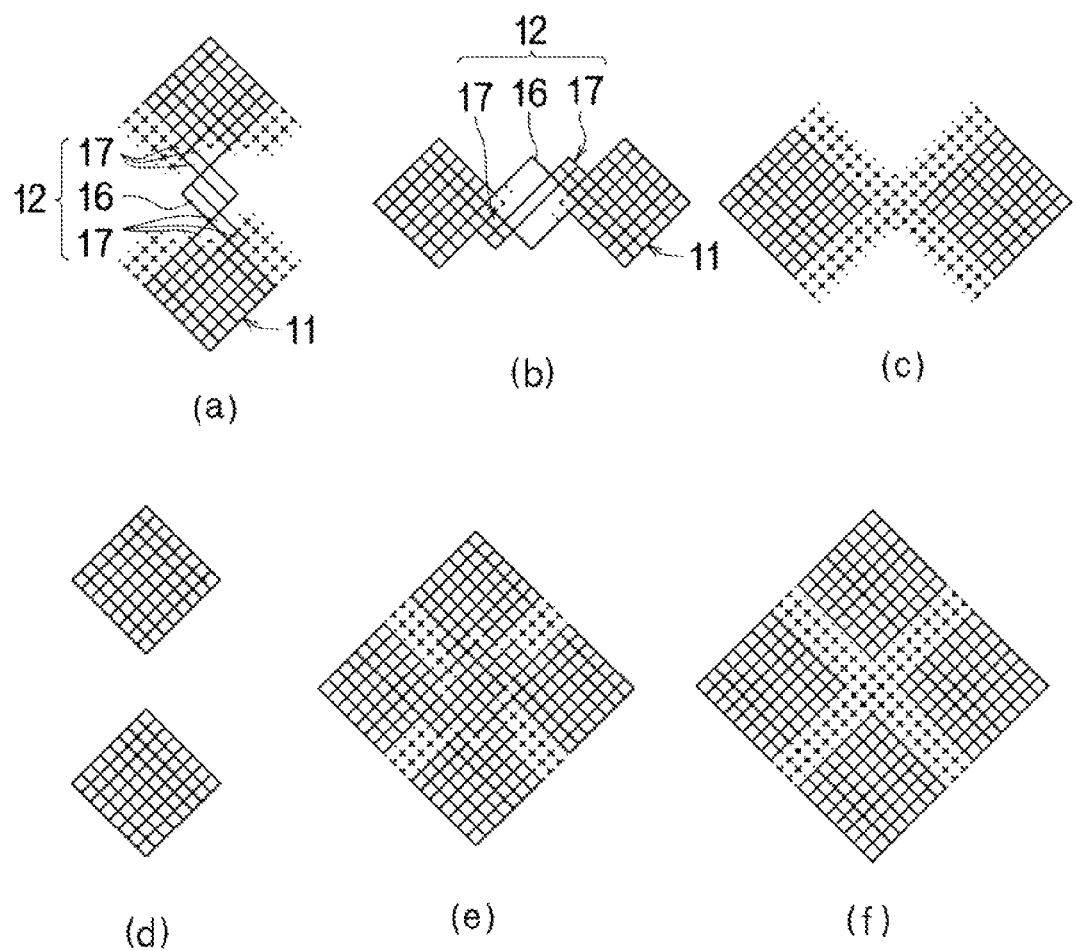
FIG. 12 shows electrode patterns of Example 4.

An optically transparent electrode 4 was obtained in the same manner as in Example 1 except that a transparent manuscript A4 having the electrode pattern of FIG. 12(a) in parts in which large lattices 11 and the connector 12 are electrically connected, and the electrode pattern of FIG. 12(c) in parts in widen large lattices 11 and the connector 12 are not electrically connected; and a transparent manuscript B4 having the electrode pattern of FIG. 12(b) in parts in which large lattices 11 and the connector 12 are electrically connected, and the electrode pattern of FIG. 12(d) in parts in which large lattices 11 and the connector 12 are not electrically connected were used.

In the transparent manuscripts A4 and B4, the unit lattice 20 and the broken lattice 31 have the same line width, the same line interval, and the same line breaks as those of the unit lattice 20 and the broken lattice 31 in the transparent manuscripts A1 and B1.

The connector 12 of the transparent manuscript A3 consists of a connector lattice 16, which is a 0.75-mm square (line width: 7 μm) (consisting of three adjacent lattices, which are 0.25×0.75-mm rectangles (line width: 7 μm)); two adjacent lattices 17, which are 0.5-mm squares (line width: 7 μm) adjacent to the connector lattice 16; other two adjacent lattices, which are 0.25×0.5 mm and in contact with the 0.5-mm square adjacent lattices and the connector lattice; and yet other two adjacent lattices, which are 0.25×0.25 mm and adjacent to the 0.25×0.5-mm adjacent lattices. In contrast, the connector 12 of the transparent manuscript 34 consists of a connector lattice 16, which is a 1.25-mm square (line width: 7 μm) (consisting of two 0.5×1.25-nm rectangles (line width: 7 μm) and a 0.25×1.25-mm rectangle (line width: 7 μm)); and eight adjacent lattices 17, which are 0.25-mm squares (line width: 7 μm) electrically connecting the connector lattice 16 and the large lattices 11. Regarding the optically transparent electrode 4, FIG. 12 (e) is a view showing an electrode pattern in which large lattices 11 and the connector 12 are electrically connected, and FIG. 12 (f) is a view showing at electrode pattern in which large lattices 11 and the connector 12 are not electrically connected. In this Example, the difference in aperture ratio between the large lattice formed of a grid-like conductive part and the nonconductive part having a broken lattice where a part of a thin line is broken and electrical conductivity is lost was similar to that in Example 1.

Comparative Example 1

Figure 13:
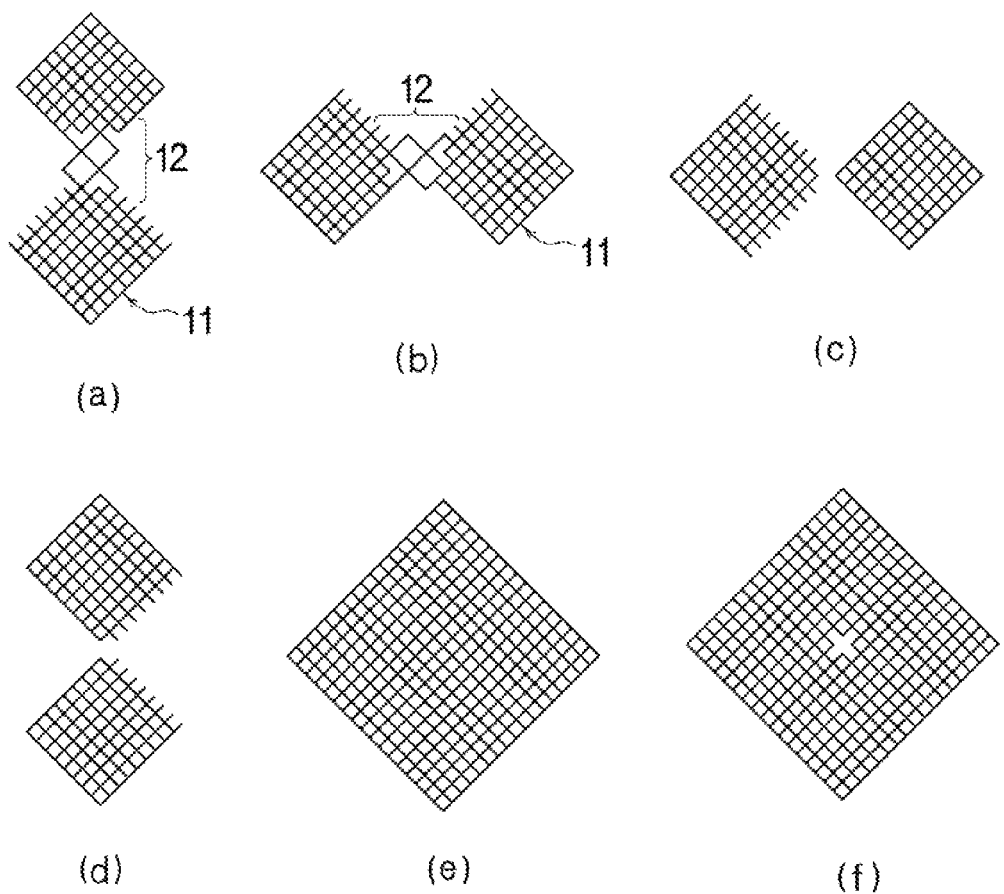
FIG. 13 shows electrode patterns of Comparative Example 1.

An optically transparent electrode of Comparative Example 1 was obtained in the same manner as in Example 1 except that a transparent manuscript A5 having the electrode pattern of FIG. 13(a) in parts in which large lattices 11 and the connector 12 are electrically connected, and the electrode pattern of FIG. 13(c) in parts in which large lattices 11 and the connector 12 are not electrically connected; and a transparent manuscript B5 having the electrode pattern of FIG. 13(b) in parts in which large lattices 11 and the connector 12 are electrically connected, and the electrode pattern of FIG. 13(d) in parts in which large lattices 11 and the connector 12 are not electrically connected were used.

In the transparent manuscripts A5 and B5, the unit lattice 20 has the same line width and the same line interval as those of the unit lattice 20 in the transparent manuscripts A1 and B1.

The connector 12 of the transparent manuscripts A5 and B5 consists of connector lattices 16, which are 0.5-mm squares (line width: 7 µm) arranged in a zig-zag manner. Regarding the optically transparent electrode of Comparative Example 1, FIG. 13 (e) is a view showing an electrode pattern in which large lattices 11 and the connector 12 are electrically connected, and FIG. 13 (f) is a view showing an electrode pattern in which large lattices 11 and the connector 12 are not electrically connected.

Comparative Example 2

Figure 14:
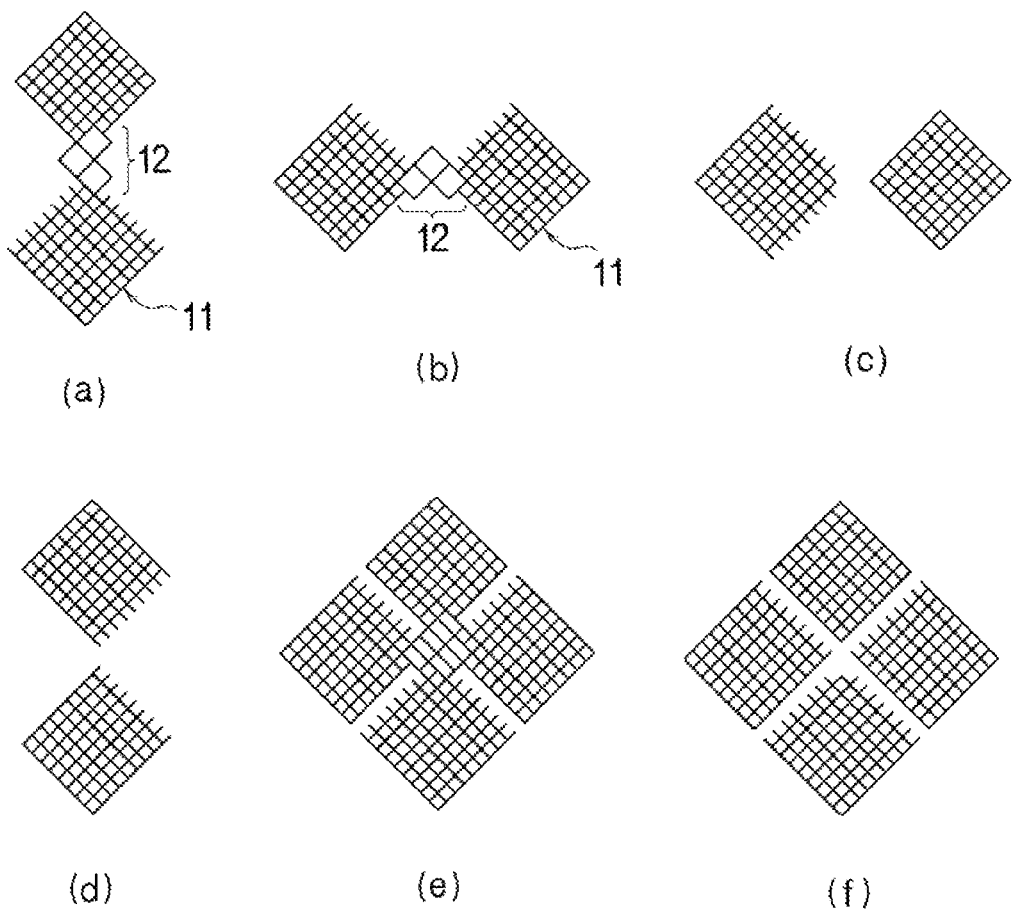
FIG. 14 shows electrode patterns of Comparative Example 2.

An optically transparent electrode of Comparative Example 2 was obtained in the same manner as in Example 1 except that a transparent manuscript A6 having the electrode pattern of FIG. 14(a) in parts in which large lattices 11 and the connector 12 are electrically connected, and the electrode pattern of FIG. 14(c) in parts in which large lattices 11 and the connector 12 are not electrically connected; and a transparent manuscript B6 having the electrode pattern of FIG. 14(b) in parts in which large lattices 11 and the connector 12 are electrically connected, and the electrode pattern of FIG. 14(d) in parts in which large lattices 11 and the connector 12 are not electrically connected were used.

In the transparent manuscripts A6 and B6, the unit lattice 20 has the same line width and the same line interval as those of the unit lattice 20 in the transparent manuscripts A1 and B1.

The connector 12 of the transparent manuscripts A6 and B6 consists of connector lattices 16, which are 0.5-mm squares (line width: 7 µm) arranged in a zig-zag manner. Regarding the optically transparent electrode of Comparative Example 2, FIG. 14 (e) is a view showing an electrode pattern in which large lattices 11 and the connector 12 are electrically connected, and FIG. 14 (f) is a view showing an electrode pattern in which large lattices 11 and the connector 12 are not electrically connected.

The visibility of the optically transparent electrodes 1 to 4 of the present invention and the optically transparent electrodes of Comparative Examples 1 and 2 obtained as above was visually evaluated. The criteria were as follows: clearly visible electrode pattern was 1, quickly visible electrode pattern was 2, barely visible electrode pattern was 3, almost invisible electrode pastern was 4, and completely invisible electrode pattern was 5. The evaluation results are shown in Table 1. Needless to say, to achieve the objective of the present invention, a higher value is preferred in Table 1.

TABLE 1

|  | Visibility |
| --- | --- |
| Optically transparent electrode 1 of the present invention | 5 |
| Optically transparent electrode 2 of the present invention | 4 |
| Optically transparent electrode 3 of the present invention | 5 |
| Optically transparent electrode 4 of the present invention | 5 |
| Optically transparent electrode of Comparative Example 1 | 2 |
| Optically transparent electrode of Comparative Example 2 | 1 |

The results in Table 1 clearly show that the optically transparent electrodes of the present invention have low visibility.

Example 5

As an optically transparent base material, the same polyethylene terephthalate film as used in Example 1 was used.

The same physical development nuclei coating liquid as used in Example 1 was prepared, applied onto the optically transparent base material, and dried to provide a physical development nuclei layer.

Subsequently, the same intermediate layer, the silver halide emulsion layer, and the protective layer as used in Example 1 were applied in this order (from closest to the optically transparent base material) onto the above physical development nuclei layer, and dried to give a silver halide photosensitive material.

The obtained silver halide photosensitive material and the transparent manuscript A1 were brought into close contact and fixed with a pin bar, and exposure was performed, through an optical filter which passes only light, at 254 nm, using a contact printer having a mercury lamp as a light source.

After immersion in the diffusion transfer developer used in Example 1 at 20° C. for 60 seconds, the silver halide emulsion layer, the intermediate layer, and the protective layer were washed off with warm water at 40° C., and a drying process was performed. In this way, a 0.1-µm-thick silver pattern was obtained on the optically transparent base material. This silver pattern has the same line width as that of the transparent manuscript A1.

On the other surface (not having the silver pattern) of the optically transparent base material, a physical development nuclei layer was provided in the same manner as in Example 1, and an intermediate layer, a silver halide emulsion layer, and a protective layer were further applied in this order. The obtained silver halide photosensitive material and the transparent manuscript B6 having a mirror image of transparent manuscript B1 were brought into close contact and fixed with a pin bar so that the centers 15 of the connectors of the previously-obtained silver pattern and the centers 15 of the connectors of the transparent manuscript B6 approximately coincided, that the connectors with the large lattice were arranged as shown in FIG. 9(e), and that the part not connected with the large lattice was arranged as shown in FIG. 9(f). Then, exposure was performed, through an optical filter which passes only light at 254 nm, using a contact printer having a mercury lamp as a light source.

After immersion in the above diffusion transfer developer at 20° C. for 60 seconds, the silver halide emulsion layer, the intermediate layer, and the protective layer were washed off with warm water at 40° C., and a drying process was performed. In this way, an optically transparent electrode 5 having, on the other side of the optically transparent base material, a silver pattern (0.1-µm thick) different from the previously provided silver pattern was obtained. This silver pattern has the same line width as that of the transparent manuscript B6. The electrode pattern of the obtained optically transparent electrode 5 was completely invisible as is the case with the optically transparent electrode 1. In this Example, the difference in aperture ratio between the large lattice formed of a grid-like conductive part, and the non-conductive part having a broken lattice where a part of a thin line is broken and electrical conductivity is lost was similar to that in Example 1.

REFERENCE SIGNS LIST

1 Optically transparent base material
1a Optically transparent base material
1b Optically transparent base material
2 Adhesive layer
3 Optically transparent conductive material
3a Optically transparent conductive material
3b Optically transparent conductive material
4 Thin line forming a side of a square constituting a unit lattice
5 Broken thin line
6 Nonconductive part
11 Large lattice
12 Connector
13 Line connecting the centers of two large lattices
14 Center point of large lattice
15 Center point of connector
16 Connector lattice
17, 17a, 17b Adjacent lattice
18, 19 Distance between adjacent large lattices
20 Unit lattice
21 Blank spaces surrounded by large lattices and connectors
31 Broken lattice
51 Line break
52 Square part
53 Square part
61, 71, 72 Conductive part
171, 172, 173, 174, 175, 176 Adjacent lattice
100, 100a, 100b, 100c, 100d Optically transparent electrode

The invention claimed is:

1. An optically transparent electrode produced by joining two optically transparent conductive materials each having, on one side of optically transparent base materials, a large lattice formed of a grid-like conductive part and a connector which has at least one connector lattice and which electrically connects adjacent large lattices, said connector being formed of said connector lattice only or of said connector lattice and said accompanying adjacent lattices, wherein
   the two optically transparent conductive materials are overlapped so that the centers of the connectors thereof approximately coincide,
   the connector lattices of the two optically transparent conductive materials are different in size and approximately similar in shape, and
   at least one of the two optically transparent conductive materials has a broken lattice where a part of a thin line is broken and electrical conductivity is lost at a position corresponding to the overlapped connectors and/or to a portion surrounded by the large lattice and the connector.

2. An optically transparent electrode comprising an optically transparent base material, both sides of said optically transparent base material providing a large lattice formed of a grid-like conductive part and a connector which has at least one connector lattice and which electrically connects adjacent large lattices, said connector being formed of said connector lattice only or of said connector lattice and said accompanying adjacent lattices, wherein
   the center of the connector on one side and the center of the connector on the other side are arranged so as to approximately coincide,
   the connector lattices on one side and the connector on the other side of the optically transparent base material are different in size and approximately similar in shape, and
   at least one side has a broken lattice where a part of a thin line is broken and electrical conductivity is lost at a position corresponding to the overlapped connectors and/or to a portion surrounded by the large lattice and the connector.

3. The optically transparent electrode according to claim 1, wherein the difference in aperture ratio between the large lattice formed of a grid-like conductive part and a nonconductive part having the broken lattice where a part of a thin line is broken and conductivity is lost is 1% or less.

4. The optically transparent electrode according to claim 1, wherein the large lattice is formed of a plurality of unit lattices and the interval between the thin lines of the unit lattice is 80 to 120% of the interval between the thin lines of the broken lattice.

5. The optically transparent electrode according to claim 2, wherein the difference in aperture ratio between the large lattice formed of a grid-like conductive part and a nonconductive part having the broken lattice where a part of a thin line is broken and conductivity is lost is 1% or less.

6. The optically transparent electrode according to claim 2, wherein the large lattice is formed of a plurality of unit lattices and the interval between the thin lines of the unit lattice is 80 to 120% of the interval between the thin lines of the broken lattice.

7. The optically transparent electrode according to claim 3, wherein the large lattice is formed of a plurality of unit lattices and the interval between the thin lines of the unit lattice is 80 to 120% of the interval between the thin lines of the broken lattice.

8. The optically transparent electrode according to claim 5, wherein the large lattice is formed of a plurality of unit lattices and the interval between the thin lines of the unit lattice is 80 to 120% of the interval between the thin lines of the broken lattice.

\* \* \* \* \*